United States Patent [19]
Foland, Jr.

[11] Patent Number: 5,412,669
[45] Date of Patent: May 2, 1995

[54] ADD, COMPARE AND SELECT CIRCUIT
[75] Inventor: William R. Foland, Jr., Littleton, Colo.
[73] Assignee: Cirrus Logic, Inc., Fremont, Calif.
[21] Appl. No.: 164,260
[22] Filed: Dec. 9, 1993
[51] Int. Cl.[6] .............................................. G06F 11/10
[52] U.S. Cl. ...................................... 371/43; 341/94; 341/107
[58] Field of Search ............................ 371/30, 43–46; 341/94, 107

[56] References Cited
U.S. PATENT DOCUMENTS

| | | | |
|---|---|---|---|
| 4,606,027 | 8/1986 | Otani | 371/43 |
| 5,027,374 | 6/1991 | Rossman | 371/43 |
| 5,081,651 | 1/1992 | Kubo | 371/43 |
| 5,181,209 | 1/1993 | Hagenauer et al. | 371/43 |
| 5,220,570 | 6/1993 | Lou et al. | 371/43 |
| 5,291,499 | 3/1994 | Behrens et al. | 371/43 |

OTHER PUBLICATIONS

Fettweis et al. (1991) "High Speed Parallel Viterbi Decoding: Algorithm and VLSI-Architecture" *IEEE Communications Magazine* May 1991: 46–55.
Shung et al. (1990) "VLSI Architectures for Metric Normalization in the Viterbi Algorithm" *IEEE* pp. 1723–1728.

*Primary Examiner*—Roy N. Envall, Jr.
*Assistant Examiner*—Thomas E. Brown

[57] ABSTRACT

A circuit for minimizing the number of cycles needed to add a first number of quantities together to produce a first result in parallel with the addition of a similar number of quantities to produce a second result, subtracting one result from the other to determine which result is the least, and selecting and storing the least result. For the various additions and the subtraction above named, n bit addends are divided into m upper bits and n-m lower bits. m bit addends (upper bits) are added together separately from and simultaneously with the addition of the n-m bits (lower bits). The first m bit result is subtracted from the second m bit result and the upper bit of that subtraction is adjusted according to the number of carry bits produced by the various lower bit additions and subtraction. In that manner, an accurate comparison of the two m bit results is obtained. A logic array and a mux array provide fast adjustment so that the entire add, compare, and select process is accomplished in one cycle.

15 Claims, 8 Drawing Sheets

| No. of carry-in bits | Range of Sums Producing Negative Quantity |
|---|---|
| 0 | All negative quantities |
| 1 | Max P or <= -2 |
| 2 | Max P-1; Max P or <= -3 |
| 3 | Max P-2; Max P-1; Max P or = -4 |
| -1 | 0 or <= -3 |
| -2 | +1, 0 or <= -2 |

*FIG. 9*

| | $b_{SIGN}$ $b_1$ $b_0$ | $D_3$ | $D_2$ | $D_1$ | $D_0$ | $D_{-1}$ | $D_{-2}$ |
|---|---|---|---|---|---|---|---|
| 0 | 000 | 0 | 0 | 0 | 0 | 1 | 1 |
| +1 | 001 | 1 | 0 | 0 | 0 | 0 | 1 |
| +2 | 010 | 1 | 1 | 0 | 0 | 0 | 0 |
| +3 | 011 | 1 | 1 | 1 | 0 | 0 | 0 |
| -4 | 100 | 1 | 1 | 1 | 1 | 0 | 0 |
| -3 | 101 | 0 | 1 | 1 | 1 | 1 | 0 |
| -2 | 110 | 0 | 0 | 1 | 1 | 1 | 1 |
| -1 | 111 | 0 | 0 | 0 | 1 | 1 | 1 |

*FIG. 10*

ADD, COMPARE AND SELECT CIRCUIT

This invention relates to digital circuits for adding quantities, comparing the summations and selecting the least sum, and more particularly relates to circuits for adding the upper bits of two summations separately from the lower bits in order to compare the sums and accurately determine the least sum before the exact summation quantities are found.

CROSS-REFERENCE TO RELATED APPLICATION

This application is related to application Ser. No. 07/852015 entitled "Sequence Detector" which application is incorporated herein by reference.

BACKGROUND OF THE INVENTION

Add, compare and select circuits (ACS) are used in digital sequence detectors to determine the most likely sequence of digital signals corresponding to a sequence of received signals. The received signals are compared to a variety of idealized signal sequences to determine which idealized sequence compares signal sequences to determine which idealized sequence compares most closely. In that manner the accurate detection of a sequence of received signals can be achieved. Sequence detectors may be used in many applications and will be illustrated herein in the context of a digital computing system with magnetic storage.

In digital systems, magnetic media is used to archive data and used for the interactive processing of data with the central processing unit and semiconductor memory elements. Drive electronics units for magnetic storage devices provide an interface to the host system and receive data from the host to be written to the magnetic media. The drive units also process and present data to the host that has been read from the magnetic storage media. A magnetic transducing head is connected to the drive electronics unit and is situated in close proximity to the magnetic media in order to write data to the media or read data from the media. Significant effort has been made to pack data ever more densely on the media while at the same time improving the write and read control functions to approach error-free operation. In the effort to produce dense recording and error-free retrieval, digital channels with sequence detectors have been developed to view a multi-sample period of the readback waveform produced by the transducing head. That multi-sample period is compared to an expected set of samples which correspond to various idealized data sample patterns. The detector operates to accumulate error signals with respect to the various data sample patterns and by determining the least error is able to recognize the most likely idealized data sample pattern corresponding to the received signals. A sequence detector of this type is described in the aforementioned U.S. patent application Ser. No. 07/852,015 incorporated herein by reference.

Limiting factors in packing data onto the magnetic media are frequently associated with the readback operation where the magnetic transition results in an electrical pulse in the head which is transferred from the head to the drive electronics unit for amplification and detection. The pulse signals at the head are difficult to detect accurately since they are small and subject to obfuscation. In general, as magnetic transitions are more densely packed on the media the accurate reading of those transitions is more sensitive to distortion, timing variations and noise.

In order to improve the capability of accurately detecting densely packed data, sequence detectors have been developed for use in read channel circuits. As mentioned above, sequence detectors involve the accumulation of error data in viewing a sequence of received data samples. Circuits utilized to perform the operation include add, compare and select (ACS) circuits. Unfortunately, the ACS circuits can themselves be a limiting factor on the ability to pack data more densely on magnetic media because of the time needed for the ACS circuits to process the received data. Accumulated error value is indicative of the total amount of noise in a system and to accurately reflect the error value in a noisy system can result in binary numbers many bits in length, in one implementation 13 bits in length. In order to recognize the data bit pattern with the least accumulated error, 13 bit numbers are subtracted from each other to determine the least quantity. Since adding (or subtracting) multi-bit numbers is a time consuming process, the add, compare, select circuit itself becomes a limiting factor on the ability of a system to pack data on the magnetic media.

It is an object of this invention to modify ACS circuits for use in a sequence detector to optimize the time needed to identify the idealized pattern representing closest match to the received pattern.

As mentioned above, digital information is frequently stored by recording patterns of magnetization on a surface such as a magnetic disk or tape. A recorded magnetization pattern induces a time varying electrical response signal in a sensor or read head as the magnetic pattern moves past the read head. The resulting signal is processed electronically to reconstruct the bits of the digital information stored on the disk or tape. The heads are positioned close to the magnetic surface. When the magnetic surface is moved under the head, the head responds to the magnetic flux from the magnetized medium so that a voltage pulse is produced each time the head encounters a transition in the direction of magnetization of the medium.

Successive magnetic transitions along a track necessarily alternate in polarity. A transition from north to south magnetization is followed by a transition from south to north. The polarity of the voltage pulses induced in the read head alternate from plus to minus with the polarity of the transitions.

Ideally, the pulses induced in the read head would be impulse functions of infinite amplitude, zero width, and some finite energy. In reality, there are band width limiting factors in the write process, in the recording medium, and in the read process which produce a pulse of finite amplitude and width. The shape of the pulse is determined by many factors including the geometry of the head, distance between head and medium, magnetic properties of the medium and the head, etc.

To prepare a sensed analog pulse train produced by the head for processing by a sequence detector, the signals are amplified, filtered and shaped. The analog pulse train is then sampled at particular discrete time intervals after which the sample train may continue to be filtered before the samples are presented to the sequence detector.

FIG. 1 shows an idealized isolated pulse 9 with the associated discrete time samples $R_0$ through $R_5$. In setting up the system with a programmable sequence detector like that described in U.S. patent application Ser.

No. 07/052,015, one of the digital sample values is scaled to be represented by an arbitrary value, for example a "1", the other digital samples taking a ratio thereto. In FIG. 2, four samples are taken to represent the pulse: samples a, b, 1 and c, with a, b and c each being separate programmable values. Any desired number of samples can be taken relative to the width of the pulse although at the current time the number of samples taken is usually either 2, 3 or 4. In the idealized form for the four sample system shown in FIG. 3, b equals 1 and a and c each equal one-third.

When signal transitions are packed together on magnetic media, the sample values presented to the sequence detector are combinations of the packed adjacent pulses. For example, if pulses are constrained by a run-length limited code where d = 1, adjacent "one" pulses in the encoded data are stored with an interposed zero pulse. Consequently, idealized sample values for two adjacent pulses are as follows (sample rate is equal to the channel bit rate):

|  | $R_0$ | $R_1$ | $R_2$ | $R_3$ | $R_4$ | $R_5$ | $R_6$ |
|---|---|---|---|---|---|---|---|
| Pulse 1: | 0 | a | b | 1 | c | 0 | 0 |
| Pulse 2: |  |  | 0 | −a | −b | −1 | −c |
| combined 1 + 2: | 0 | a | b | 1 − a | c − b | −1 | −c |

As mentioned above, when a magnetic transition occurs, the polarity of the induced electrical signal changes. Note that for the combined pulse 1 and pulse 2 idealized samples, the positive pulse may be identified by the presence of the position "1" value occurring at sample time $R_3$ and the negative going pulse may be identified by the presence of the negative "1" value occurring at sample time $R_5$. Thus, the presence of a "1" in the idealized sample value is used to identify the presence of a magnetic transition and therefore a change in electrical polarity. In the data detection circuits, the "1" values are translated as defining the rise of a digital pulse on a first clock and the fall on the second clock.

FIG. 2 illustrates a received signal waveform 15 with two directly adjacent pulses separated by an interposed zero pulse. The received sample values $R_0$–$R_6$ are compared to the idealized sample values in a sequence detector to determine the best match. For example, received sample value $R_3$ might be compared to idealized sample value "1" as part of the process to determine whether an isolated pulse 1 is present. $R_3$ might also be compared to the idealized sample value "−a" as part of the process to determine whether an isolated pulse 2 is present. And $R_3$ might be compared to the idealized sample value "1−a" as part of a process to determine whether two directly adjacent pulses such as shown in FIG. 2 are present.

FIG. 3 shows the state diagram for a ten-state sequence detector such as described in the above-mentioned patent application. The detector of FIG. 3 is organized to reflect all possible states into which it can arrive. For example, the diagram shows that it can arrive at state 8 through either a transition from state 1 or a transition from state 4. In determining which of the transitions is most likely, the received sample signal is compared to the expected sample value of "a−c" and the difference is an error that is added to the previous error tally associated with node 1. In this case, the received sample signal is also compared to the expected sample value "a" and the difference is an error that is added to the error tally associated with node 4. The accumulated errors for each of the two paths are totaled and compared. Only the most likely path (the one with the smallest error total) is retained in a path memory as the error tally for state 8.

A subsequent received sample signal will move the state of the sequence detector from state 8 to state 9 and the value of that subsequent received sample signal is compared to an expected sample with a value of "b" as shown in FIG. 3 That difference is an error, called a "branch metric", and is accumulated with the path error for state 8 to total a new "path metric", that is the error tally associated with state 9.

FIG. 4 is a different way of illustrating the state diagram shown in FIG. 3 in which the various states are vertically disposed and the transitions between the states form a lattice network. For example, if the current state is state 8, an inspection of the state diagram shows that arrival at state 8 can be from either state 1 or state 4. The ACS circuit associated with node 8 will therefore compare the received sample signal $R_1$ with the expected value of "a" should the entry to state 8 be from state 4, and an expected value of "a−c" for the path from state 1. Each of these error quantities, the branch metric, is added to the accumulated error, the path metric, for the respective previous states. For example, the branch metric representing the difference between the received sample signal $R_1$ and "a−c" is added to the accumulated error, path metric $PM_1$, associated with state 1. The branch metric representing the difference of the sample signal $R_1$ minus "a" is added to the accumulated error, that is the path metric $PM_4$, for state 4. The mathematical expressions for these operations are as follows:

$$PM_1 + [R_1 - (a-c)]^2 = \text{the new path metric from state 1.} \quad (1)$$

$$PM_4 + (R_1 - a)^2 = \text{the new path metric from state 4.} \quad (2)$$

The new path metrics, which are both possible path metrics for arriving at state 8, are compared in the ACS circuit to find which is the least. The least is stored as the path metric for state 8 and the other is discarded.

To determine the most likely path through the state diagram shown in FIG. 3, ACS circuits are associated with each of the 10 states for that sequence detector. The above-mentioned patent application reveals techniques for minimizing the number of ACS circuits associated with the sequence detector by combining certain states into a single node and generating one ACS circuit for that combination of states. The current invention can be utilized with the "folded" sequence detector of the above-mentioned patent or with an "unfolded" sequence detector such as shown in FIG. 3.

In a folded state machine such as described in the above-mentioned patent application, the idealized sample value to be compared with the received signal can be either positive or negative. With reference to FIG. 3, note that one ACS circuit can be used for both states 8 and 3 according to the teachings of the above-referenced patent application, with "+a" being the idealized sample value $I_X$ when the detector arrives at state 8 from state 4 and "−a" being the idealized sample value $I_X$ when the detector arrives at state 3 from state 7. As a consequence, there must be a ± sign in the generalized expression for determining the error from the ideal sample value $I_X$. The expression is shown below.

$$(R \pm I_X)^2 = R^2 \pm 2I_X R + I_X^2 \tag{3}$$

Again with reference to FIG. 3, note that "a−c" is the idealized sample value Iy leading into state 8 from state 4 and that "c−a" is the idealized sample value $I_Y$ leading into state 3 from state 10. Therefore, the generalized expression for the folded detectors utilizing the alternate path with idealized sample value $I_Y$ is:

$$(R \pm I_Y)^2 = R^2 \pm 2I_Y R + I_Y^2 \tag{4}$$

In comparing these two quantities, if the expression for the idealized quantity $I_Y$ is subtracted from the idealized expression for $I_X$ it may be noted that the $R^2$ term drops out and that the values $I_X^2$ and $I_Y^2$ are known constants. It may also be noted that upon receiving the signal R, the value RIx can be calculated and stored as can the value RI$_Y$. Therefore, upon arrival at either state 3 or state 8, registers within the ACS circuit will contain the values RI$_Y$, I$_Y^2$, RI$_X$ and I$_X^2$. Unfortunately, however, the $\pm$ sign in the above expressions cannot be determined prior to entering the node and therefore, the addition of the quantities I$_X$R and I$_X^2$ cannot be pipelined ahead of time. Similarly, the value I$_Y$R cannot be added to I$_Y^2$ ahead of time. This complication acts to increase the time needed to accomplish the ACS operation in a folded sequence detector resulting in additional value for the time-saving approach of this invention, described hereinafter.

Note that once the $\pm$ sign is determined, that defines the node as representing either state 3 or state 8. A "sign control bit" is associated with each node in order to keep track of which state the node currently represents. In the example described above, a negative sign control bit (1) indicates state 3, i.e., −I$_X$ and −I$_Y$, while a positive sign control bit (0) indicates state 8, i.e., +I$_X$ and +I$_Y$. The node contains a register for storing the sign control bit as well as a register for storing the path metric.

FIG. 5 illustrates a sequence detector with a received sample value, R, at the input of the detector. The sample value R represents a discrete time sample of the signal that has been read from the magnetic storage medium and then amplified, shaped, filtered and sampled to provide a sample value to the sequence detector which is recognizable by it. The received sample R is processed by the various add, compare and select modules (ACS) 10-13, so that the received sample is compared to each of the possible expected sample values. Each one of the comparisons results in an error signal of some finite amplitude. Error sums are totaled for each of the possible paths leading into each state, and one of the possible paths is chosen as a survivor for each state. Therefore, the function of the various ACS circuits is to identify the most probable path leading into the state represented by the ACS unit. The accumulated error value from each state is stored in the multi-bit path metric register of the ACS unit and comparison decisions are stored in the path memory circuit 14. After a sufficient number of samples have been received, circuit 14 will estimate the channel bit most likely associated with the received sample R, together with its surrounding sample, and produce an output signal, S, the estimated channel bit.

SUMMARY OF THE INVENTION

Briefly stated, this invention is a circuit in which the least significant or lower order bits of two multi-bit addends for a first possible path leading into a state are added together separately from and simultaneously with the most significant or upper bits of the addends. Concurrently, a second addition process may be performed for a second possible path in which the least significant bits of two addends are added together separately from and simultaneously with the most significant bits. Simultaneously with the above two additions, a third additive process for a third possible path may be commenced to once again add together the least significant bits of two addends separately from an addition of the most significant bits. As many additive processes as needed to identify possible paths may be simultaneously performed. In a sequence detector, there is one ACS unit for each node. The number of adds to be performed by that ACS unit is determined by the number of possible transition paths or arcs entering the node of the sequence detector.

The comparison of the results of the upper bit summation from each of the above three illustrative additive processes is then performed to achieve a final three sums which represent the comparison of all three quantities (neglecting carry-ins from the addition of the lower order bits). Those three sums are then adjusted according to the number of carrys from the addition of the lower order bits. That is to say, in the first additive process adding the least significant bits can result in either a zero or a one being carried into the summation of the most significant bits. Similarly in the second and third additive processes, either a zero or a one is produced by adding the least significant bits for carrying in to the summation of the most significant bits. In order to adjust the summation of the upper bits, the number of carrys produced from the least significant bit additions is used. The result is not an accurate summation of the quantities but is an accurate depiction of which quantity is the least when compared to other quantities which are the result of a similar additive process. In that manner, decision time in the ACS unit may be optimized, thereby decreasing process time in a sequence detector.

BRIEF DESCRIPTION OF THE DRAWING

The above-mentioned and other features and objects of the invention and the manner of obtaining them will become more apparent and the invention itself will best be understood by reference to the following description of embodiments of the invention taken in conjunction with the accompanying drawing, a brief description of which follows:

FIG. 9 is a chart of possibilities present for the three uppermost bit addition shown in FIG. 8.

FIG. 10 is a table showing the shift operations required by a logic array circuit to implement the logic of FIGS. 8 and 9.

DETAILED DESCRIPTION

Figure 1:
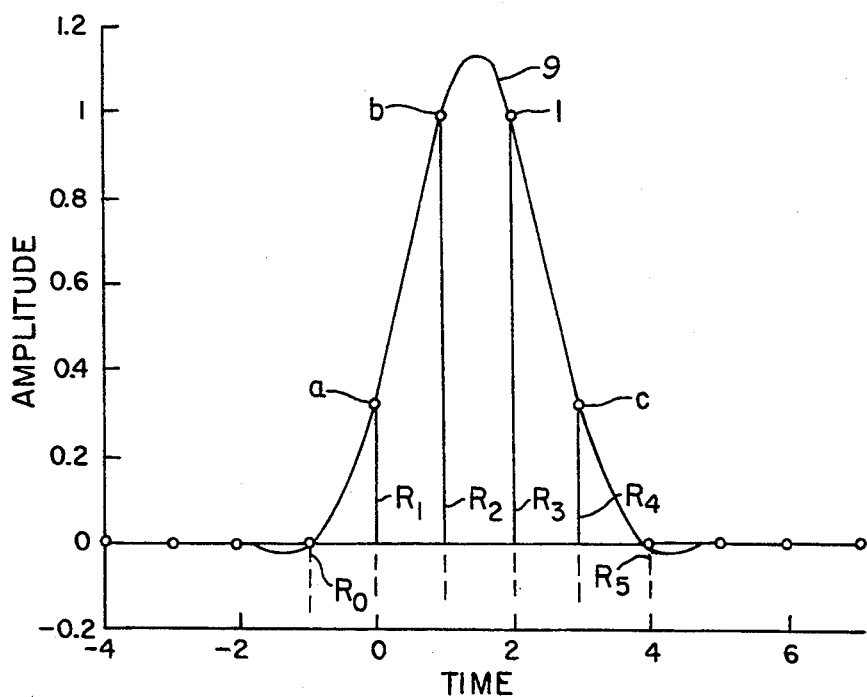
FIG. 1 shows an ideally-shaped isolated pulse with discrete time sample values taken at regular intervals.
Figure 2:
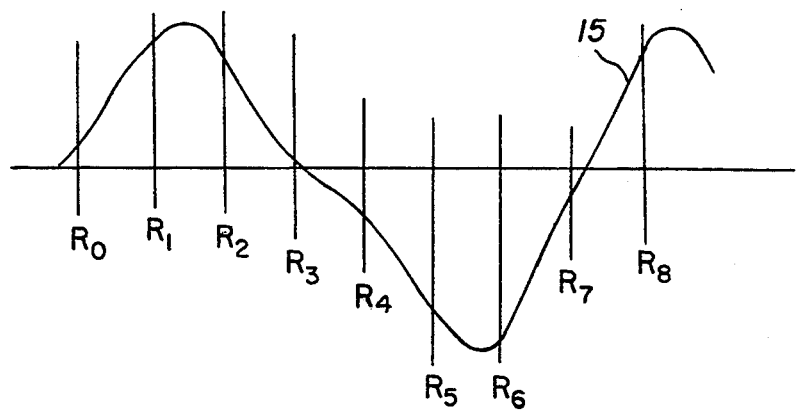
FIG. 2 shows a signal waveform of two adjacent pulses with discrete time sample values taken at regular intervals.
Figure 3:
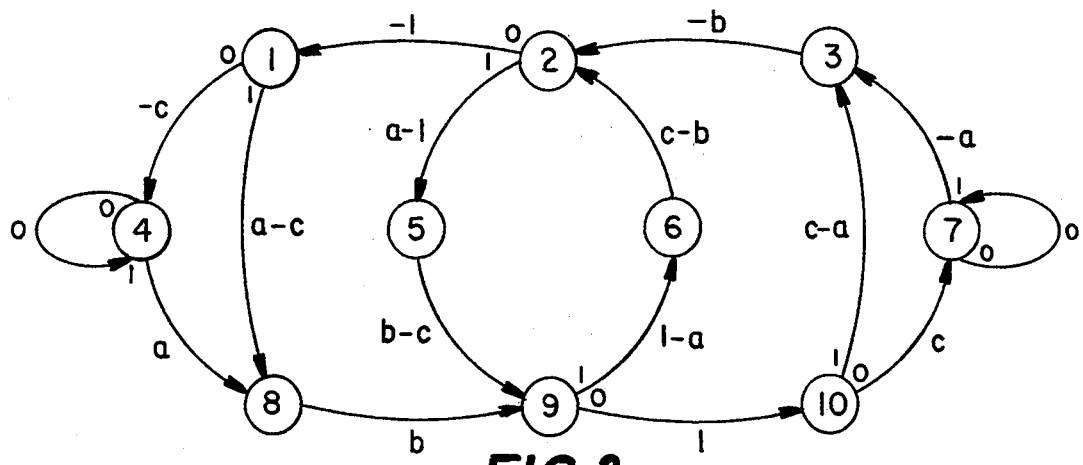
FIG. 3 shows a state diagram for a ten-state sequence detector.
Figure 4:
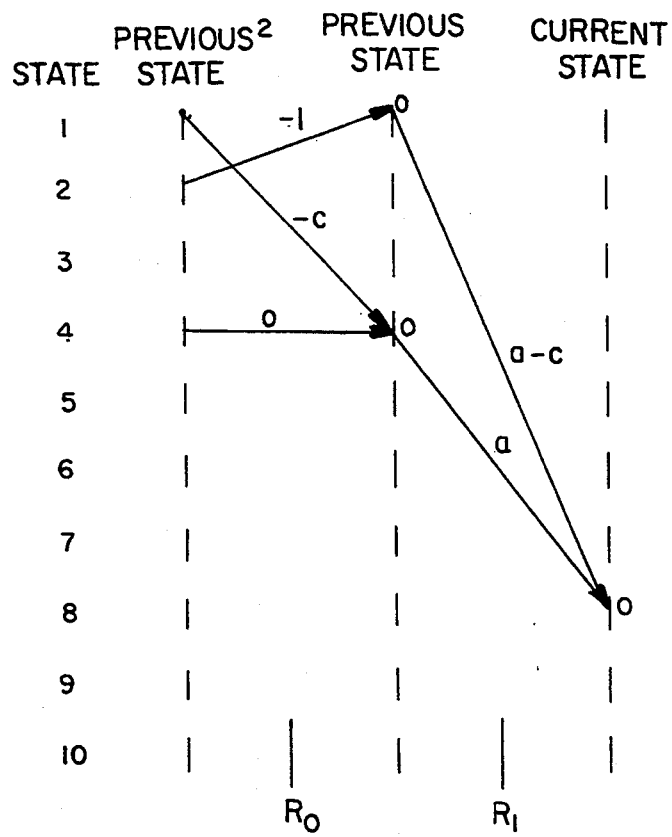
FIG. 4 is a lattice-style state diagram for a portion of the state diagram illustrated in FIG. 3.
Figure 5:
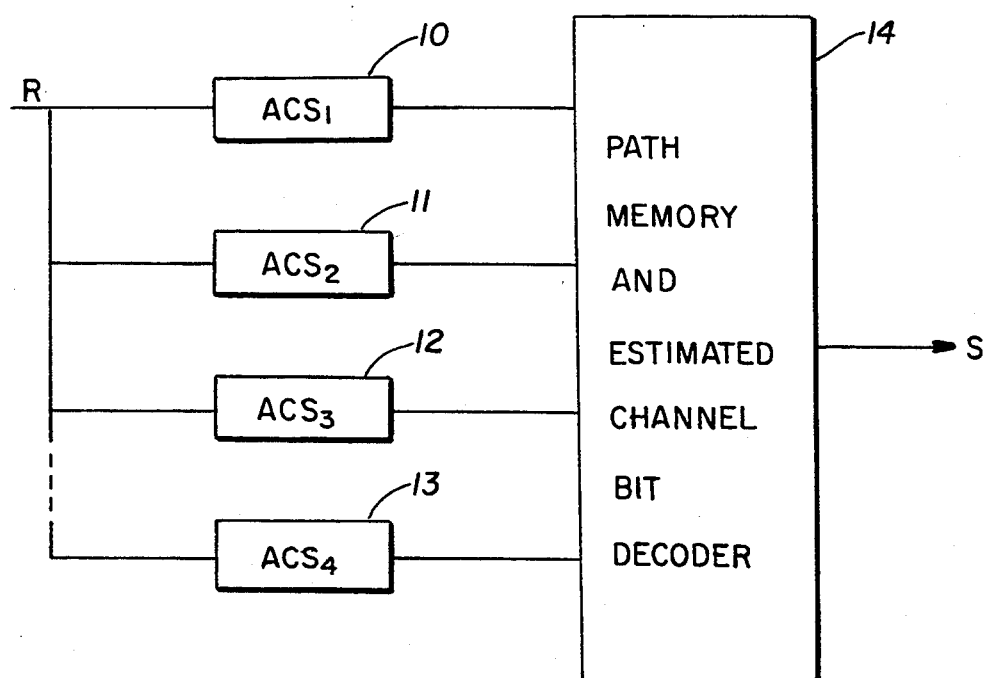
FIG. 5 is a block diagram of a sequence detector circuit showing add, compare and select (ACS) modules.

For an understanding of the features of the invention, reference is made to the drawing. In the various figures of the drawing, like reference numerals have been used to identify similar elements.

Figure 6:
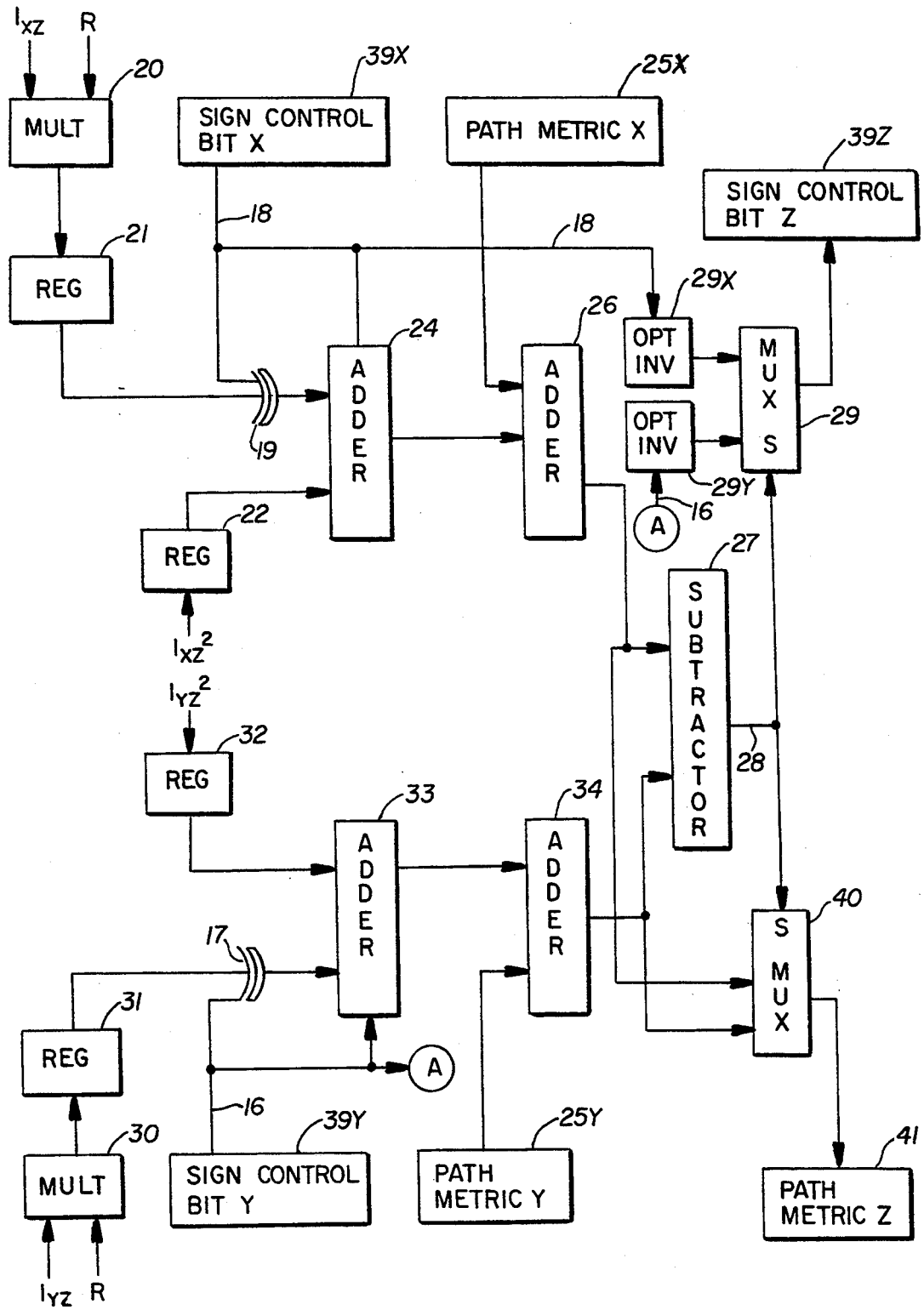
FIG. 6 shows a circuit diagram for a prior art ACS circuit.

FIG. 6 is a diagram of an ACS circuit operating with the constraint that the sign of the expected sample quantity cannot be known prior to arriving at the node (folded state machine) and therefore operating in accordance with expression (3) above. In the example ACS circuit shown in FIG. 6, two different entry paths (arcs) lead into the node associated with the ACS circuit. These two paths, termed herein the X path and the Y path, each have a positive and a negative expected idealized sample value $\pm I_{XZ}$ and $\pm I_{YZ}$. The sample value $I_{XZ}$ is the expected sample value when transitioning from state X to state Z and the sample value $I_{YZ}$ is the expected sample value when transitioning from state Y to state Z. The value $I_{XZ}R$ is obtained in the multiplier circuit 20 and stored in register 21. Similarly the quantity $I_{XZ}^2$ is stored in register 22. The sign control bit from the originating node corresponding to the X path signifies whether a positive going or negative going pulse is in process. The sign control bit is stored in flip-flop register 39X and when the sign control bit is high, a negative value is indicated and the exclusive OR circuit 19 is used to complement the $I_{XZ}R$ value adding the carry-in on line 18 in adder 24 together with the $I_{XZ}^2$ quantity stored in register 22.

It may be observed that two's complement additive processes are used in FIG. 6 wherein the most significant bit of the quantity represents the sign of the quantity, with "zero" in the upper bit indicating a positive value and "one" in the upper bit representing a negative quantity.

The output of the adder 24, the sum of the constant $I_{XZ}^2$ and the $I_{XZ}R$ term, is the branch metric of the X path and is provided to adder 26 for adding the branch metric with the previously accumulated path metric for the X path contained in register 25X. The new path metric for the X path is then sent to subtractor 27 for comparison to the new path metric for the Y path.

In the Y path the constant $I_{YZ}^2$ has been previously calculated and stored in register 32. $I_{YZ}$ and R values are multiplied in circuit 30 and provided to register 31. The sign control bit from the originating node corresponding to the Y path is stored in register 39Y and when the sign control bit is high, a negative value is indicated and the exclusive OR circuit 17 is used to complement the $I_{YZ}R$ term for input to adder 33 with the carry-in on line 16. The $I_{YZ}R$ term is then added to the $I_{YZ}^2$ quantity in the adder 33 to provide an output which is the branch metric for the Y path. The branch metric is then provided to adder 34, together with the previously accumulated path metric for the Y path located in register 25Y. The output of adder 34 is the new path metric for the Y path.

The new path metric for the Y path represents a potential new path metric for the state associated with the ACS unit, as does the new path metric for the X path. To determine which path represents the least quantity, that is the least error from the idealized sample values, the new path metric for the Y path is subtracted from the new path metric for the X path in subtractor 27. If the result carries a one bit in the uppermost bit, a negative quantity has resulted (two's complement convention) thereby indicating that the Y path provides a larger path metric than the X path. If the result is a zero bit in the upper bit location, the Y path has provided a new path metric which is less than the X path. In that manner, the upper bit of the output of subtractor 27 on line 28 can be used to select which new path metric is the least. That least path metric is then selected through the mux circuit 40 as the path metric for node Z. That quantity is stored in the path metric register 41 associated with the ACS circuit for the Z node.

The upper bit output on line 28 is also used to select the sign control bit for node Z through mux circuit 29 for storage in register 39Z. In that manner node Z is identified with the correct state. Note, however, that the sign control bit for node Z is unknown until the subtractive process in subtractor 27 is complete, thus preventing pipelining operations involving the sign bit. When, for example, the X path has been identified as providing the least path metric, the sign control bit associated with the node from which the X path originates is selected for storage in register 39Z as the sign control bit for node Z. The sign control bit X is directly moved into register 39Z unless the idealized sample for the X path indicates that a magnetic transition is present in that path. In such case, the sign control bit is changed by the complement circuit, invertor 29X, before storage in register 39Z. As mentioned above, whenever the idealized sample value contains a "1," a transition is present.

Figure 7:
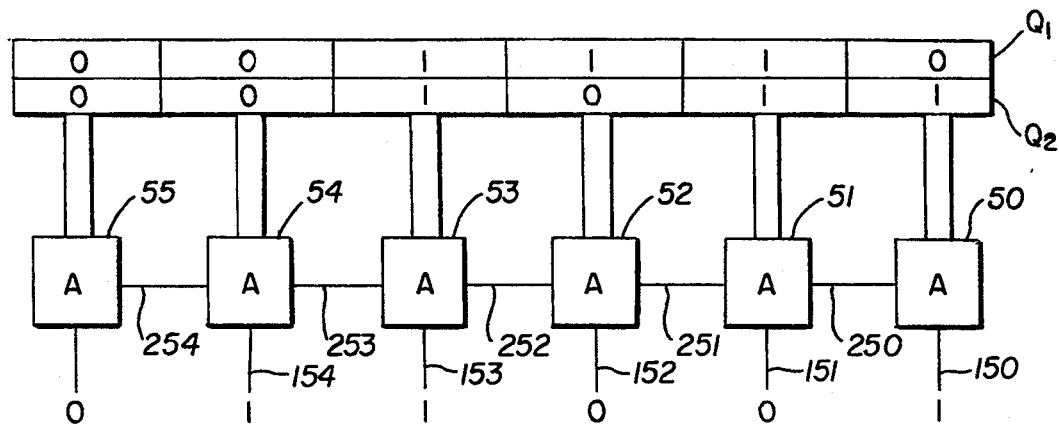
FIG. 7 illustrates a six-bit adder circuit.

As mentioned above, the need to pack data ever more densely on a magnetic disk and still accurately detect the data an important object of this invention. Note, however, that in FIG. 6 there are three additive processes to be performed before a path metric for the node can be determined, adders 24 and 33 produce branch metrics for each path, then adders 26 and 34 produce new path metrics for each path, and finally the subtractor 27 determines which new path metric is least. Since the accumulated error quantities are the path metrics, they can achieve a significant value if the system is noisy. In one implementation, there are 13 bits associated with the path metric values, and consequently the adders must be able to handle 13-bit quantities. FIG. 7 illustrates how slow that process can be.

In FIG. 7 two 6-bit quantities, $Q_1$ and $Q_2$ are added together, the first quantity $Q_1$ being the bit sequence 001110 and the second quantity $Q_2$ being the bit sequence 001011. The adder circuit 50 receives as addend input the least significant bits 0 and 1. Upon adding these bits, the output line 150 carries a 1 bit with the carry line 250 having a 0 bit. The carry line 250 is connected to add module 51 wherein the input addend bits 1 and 1 from quantities $Q_1$ and $Q_2$ are added to the carry bit of 0 on line 250 providing an output of 0 on line 151 and a carry of 1 on line 251. The carry bit on line 251 is input to the add module 52 where the summation of the input addend bits 1 and 0 with the carry bit of 1 results in an output bit of 0 on line 152 and a carry bit of 1 on line 252. The carry bit of 1 on line 252 is input to the add module 53 which also receives as input the addend bits 1 and 1 which are added together with the carry bit of 1 to produce an output bit of 1 on line 153 and a carry bit of 1 on line 253. The carry bit of 1 on line 253 is input to the add module 54 where it is added to the input addend bits which are both 0, thus providing an output bit of 1 on line 154 and a carry of 0 on line 254. The carry line 254 is connected to the add module 55 where the carry bit 0 is added to the input addend bits (which are both 0) resulting in an output bit of 0 on line 155. In the two's complement convention, the uppermost bit of the summation is a 0 on line 155 thus indicating a positive output quantity which is 011001.

Note that the add module 51 cannot act until it receives the input carry from add module 50 and that add module 52 cannot complete its addition until it receives the input carry from add module 51. FIG. 7 illustrates a 6-bit adder, with add module 55 waiting for the completion of the work done by all the previous add modules 50–54. If this were a 13-bit adder the final add module would not be able to complete its operation until all of the previous 12 add modules had sequentially completed their work. Thus, FIG. 7 illustrates the time-consuming nature of adding large numbers.

As discussed above with reference again to FIG. 6, there are three different additive processes taking place before the path metric for node Z can be determined. Since three additive processes, such as shown in FIG. 6, are time consuming and therefore difficult or impossible to perform within a single cycle of the operation of the sequence detector, the ACS circuits can act to increase the time needed to detect the signals present on the magnetic disk and in that manner act as a limiting factor on the density of data storage on the disk. The current invention seeks to perform the additive processes shown in FIG. 6 in a manner which allows the needed determinations to be performed within one cycle and thereby minimize the impact of the ACS circuits on the density of data storage.

Basically, the speed of the ACS operation in FIG. 6 is determined by the speed with which three numbers can be added by adder 24 and in parallel by adder 33, a second two numbers added by adder 26 and in parallel by adder 34, the resultant summations of the parallel paths compared (which involves a subtracting operation), and then selecting the lowest summation. The invention herein, illustrated in FIGS. 8–13, allows for the selection of the lowest quantity, that is the correct path, without determining the exact value of the new path metric (an unadjusted path metric). On the following cycle those carry bits not included in the calculation of the unadjusted path metric are included during the addition process in which the new branch metric of the following cycle is calculated. Therefore, the invention herein involves a circuit for accurately determining the lowest path metric before actually determining its exact value.

In essence, the invention is capable of producing the correct sign bit (uppermost bit) out of the compare circuit prior to calculating the compared quantities. Only the relative values are significant in achieving the correct sign bit from the compare operation. In order to minimize the amount of time needed to obtain that sign bit, the invention herein provides a circuit that adds the most significant (upper) bits and the least significant (lower) bits separately and simultaneously. However, where upper bits are added together without the benefit of the carry from the lower bits, the resultant quantity is not precise. The effect of the carrys, however, is calculated by adding the number of carrys from the various lower bit additive processes together so that the upper bit summation can be adjusted to provide a result which includes the effect of the carry bits from the various lower bit additions. In that manner, the correct uppermost bit is obtained and therefore the correct sign even though the carrys are not included in the calculation (but their effect on the uppermost bit is included).

To illustrate, suppose that the upper 3 bits of each additive process are added together separately from the lower bits. Thus, with reference to FIG. 6, suppose that the upper 3 bits in register 21 are added in adder 24 to the upper 3 bits in register 22. That sum is added in adder 26 to the upper 3 bits in path metric register 25. That sum represents the upper 3 bits of the unadjusted, new path metric for the X path (unadjusted since it does not include carrys from the lower bit addition) and is compared to the upper 3 bits of the unadjusted new path metric from the Y path in subtractor 27. The result of this process must be adjusted by the number of carrys from the simultaneous addition of the lower order bits for each of the additive processes in order to arrive at an accurate comparison.

Suppose, for example, that when adding the lowermost bits of the quantities added in adders 24 and 33 the results are both carry-outs of 0. Suppose further that when adding the lowermost bits of the addends in the adders 26 and 34 the results are both carry-outs of 0. Suppose further that when subtracting the lowermost bits of the addends used for the subtractor 27, the result is a third carry-out quantity of 0. In such case, the adding of the lower bits does not affect the addition of the upper bits, and consequently the uppermost bit output from the adding of the upper 3 bits accurately represents a positive or negative value. That value is used to select the least path metric by mux 40.

Suppose however, that the addition of the lowermost bits in adder 24 result in a carry-out of 1. Assuming that none of the other additive processes produce a carry-out bit of 1, the final comparison output of subtractor 27 must be adjusted by 1 positive carry bit. Should there have been two positive carry bits, the output of subtractor 27 must be adjusted by those 2 bits, and if there were three positive carry bits, the output of subtractor 27 must be adjusted by 3 bits. Note that the carry-in bits from the Y path are negative carry-in bits. That is, if the addition of the lower order bits in adder 33 produces a carry of 1, it is negative. Also, a carry from adder 34 is a negative carry. Therefore, if the sum of the carry bits is −1 or −2, the final comparison output of subtractor 27 must be adjusted by one or two negative bits.

Figure 8:
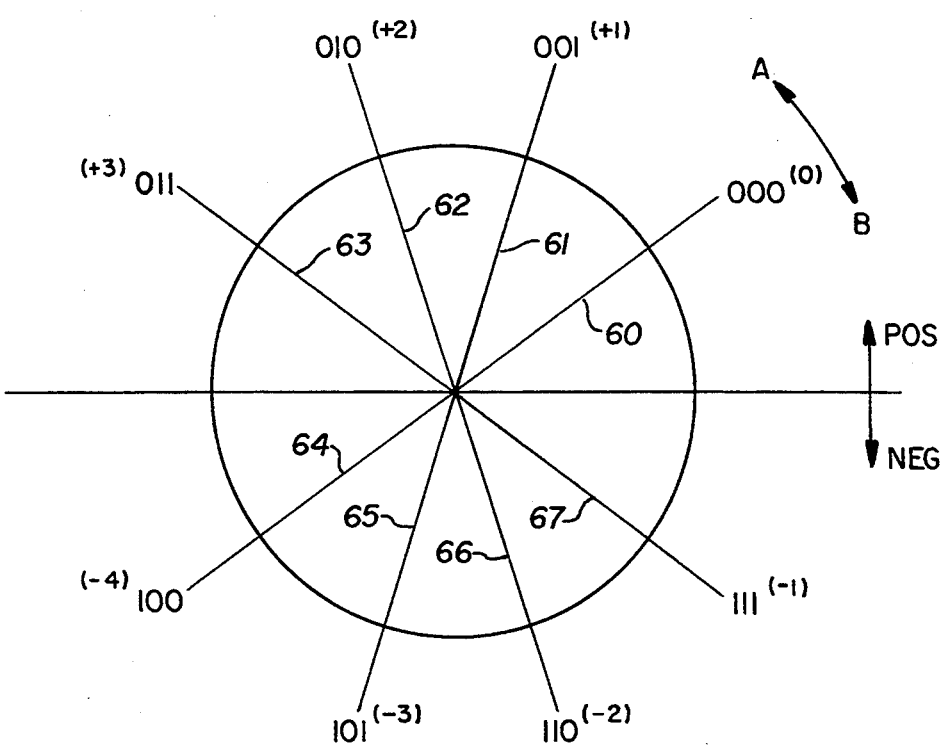
FIG. 8 is a graphical illustration for showing the adjustment needed to include the effect of carry bits when three uppermost order bits are added separately from the lowermost bits.

FIG. 8 is a graphical illustration for explaining the adjustment that is needed for the case where 3 upper bits are added separately from the lower bits. Should the separate addition of the upper 3 bits result in an output from subtractor 27 of 000, that output is shown as lying along the line 60 in FIG. 8. Should the summation be a value of 001, that output is shown as lying along the line 61. Should the summation equal 010, the output is shown as lying along line 62. Should the output be 011, it would lie along line 63. Note that the uppermost bit in all of these additions is 0, thus indicating a positive value. If the output of subtractor 27 has a 1 in the uppermost bit, the summation will lie along one of the lines 64 through 67. FIG. 8 graphically illustrates all of the possibilities that can be derived from adding the uppermost 3 bits.

Should the sum of the carry bits from the separate adding of the lowermost bits in each of the five additive (and subtractive) processes be 0, the adding of the uppermost bits is unaffected by the carry bits. If, however, the sum of the carrys from all of the lower bit five additive processes is one positive carry, that bit must be added to the upper bit sum thus shifting the sum in the direction A by 1 bit. If the lower bit additive processes produce a sum of 2 carry bits, then the upper bit sum must be shifted by 2 bits in the direction A. And finally, if the sum of the carrys is 3, the upper bit sum must be shifted by 3 bits in the direction A.

Since carrys from the adders 33 and 34 are negative (since the Y branch is subtracted in subtractor 27), the sum of the carrys could be $-1$ or $-2$. If the sum of all the carrys is $-1$, the upper bit sum must be shifted in the direction B by one bit. If the sum of all the carrys is $-2$, the upper bit sum must be shifted 2 bits in direction B.

The logic expressed above for the 3 bit case is shown in FIG. 9 for the generalized case in terms of what sum the upper bits must total in order to produce a negative output, that is, a 1 in the uppermost bit of the output of subtractor 27 for the various possible carry sums. FIG. 9 shows that if the sum of the carry-in bits is 0, any negative upper bit summation will produce a negative output. If the sum of the carry-in bits is a positive one, a shift in the direction A occurs, and consequently a negative quantity will be produced only if the upper bit sum is the maximum positive quantity or less than or equal to $-2$. If the sum of the carry-in bits equals a positive 2, then the upper bit sum must be either the maximum positive quantity, the maximum positive quantity minus 1, or equal to or less than $-3$. Finally, if the sum of the carry-in bits is a positive three, the resultant upper bit sum is shifted by three places to produce a negative quantity, and the upper bit sum must be either the maximum positive quantity, the maximum positive quantity minus 1, the maximum positive quantity minus 2, or a negative quantity less than or equal to $-4$. The logic of FIG. 9 can be extended where the sum of the carry-in bits can total a positive sum greater than three and where the number of upper bits in the addends is greater than three.

FIG. 9 also shows which upper bit summations produce a negative quantity when the sum of the carrys is negative. For a negative carry sum of $-1$, the upper bit sum must be either 0 or a negative sum equal to or less than $-3$. For a negative carry sum of $-2$, the upper bit sum must be either a $+1$, a zero, or a negative sum equal to or less than $-2$. The logic of FIG. 9 can be extended when the sum of the carry-in bits can total a negative sum of less than $-2$ and where the number of upper bits in the addends is greater than three.

In order to explain the invention in an illustrative embodiment, the logic shown in FIGS. 8 and 9 is implemented in a logic array circuit 96 (FIG. 13) according to the table of FIG. 10 for the specific case in which the three most significant bits of two n bit addends produce a three bit sum as shown at 100, $b_{sign}$, $b_1$, $b_0$. If that sum is the quantity "111", as shown at 101, the shift operation required by the logic array 96 will output a negative signal if the sum of the carrys is 0, $-1$ or $-2$. That is shown in FIG. 10 by output signal $D_0=1$, $D_{-1}=1$, and $D_{-2}=1$, while other output signals $D_3$, $D_2$, and $D_1$ all equal 0. Similarly, if the summation of the upper 3 bits results in a quantity "110", the required shift operation to produce a negative signal results if the summation of the carrys is 0, 1, $-1$ or $-2$. That is shown in FIG. 10 by output signals of the logic array $D_0$, $D_1$, $D_{-1}$ and $D_{-2}$ equal to 1 while the other output signals $D_3$ and $D_2$ are 0. If the summation of the upper 3 bits results in a quantity "000", $D_{-1}$ and $D_{-2}=1$ and the summation of the carrys provides a negative result for all signals $D_0$–$D_3$ equal to 0 and $D_{-1}$ and $D_{-2}=1$. Thus, the logic array 96, built according to the logic shown and described in FIGS. 8, 9 and 10, provides six output signals, $D_3$ through $D_{-2}$, to implement the correct shifting of the summation result of the upper bit operation according to the sum of the carrys from the lower bits. The actual shifting of the result is performed through the operation of a mux circuit 97.

Figure 11:
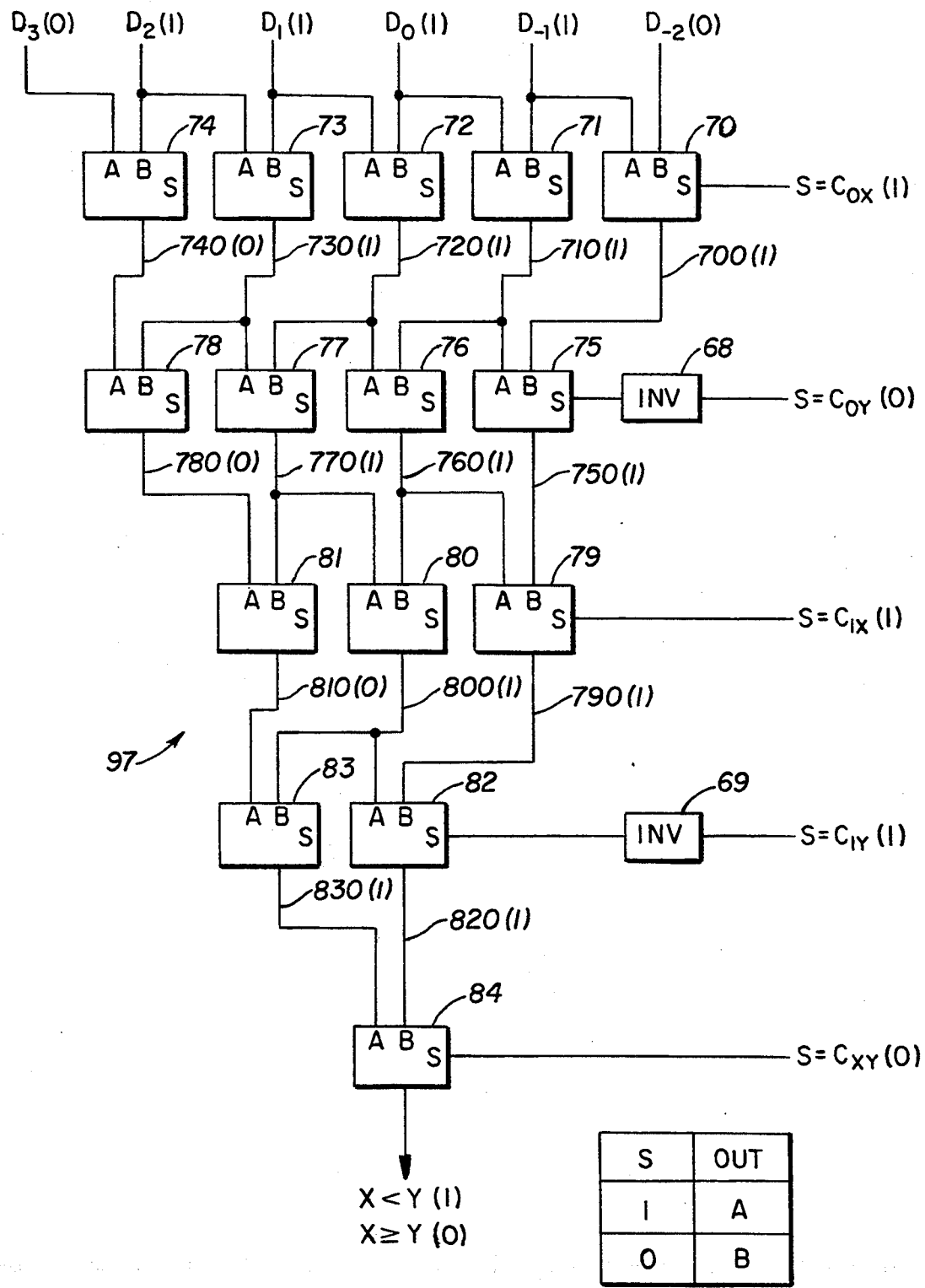
FIG. 11 shows details of a mux circuit using the output of a logic array according to FIG. 10 to adjust the upper bit comparison.

FIG. 11 shows the details of a mux circuit 97 receiving input from the logic array 96. Array 96 is built according to the logic of FIG. 10 to provide the proper input signals to enable the adjustment of the upper bit comparison from subtractor 27' (FIG. 13) to account for the shifting effect of the five carrys from the lower bit additive processes shown in FIG. 12 and thereby accurately determine the path metric providing the closest match. Input signals to the mux circuit 97 include the decode values $D_3$ through $D_{-2}$ from logic array 96.

Figure 12:
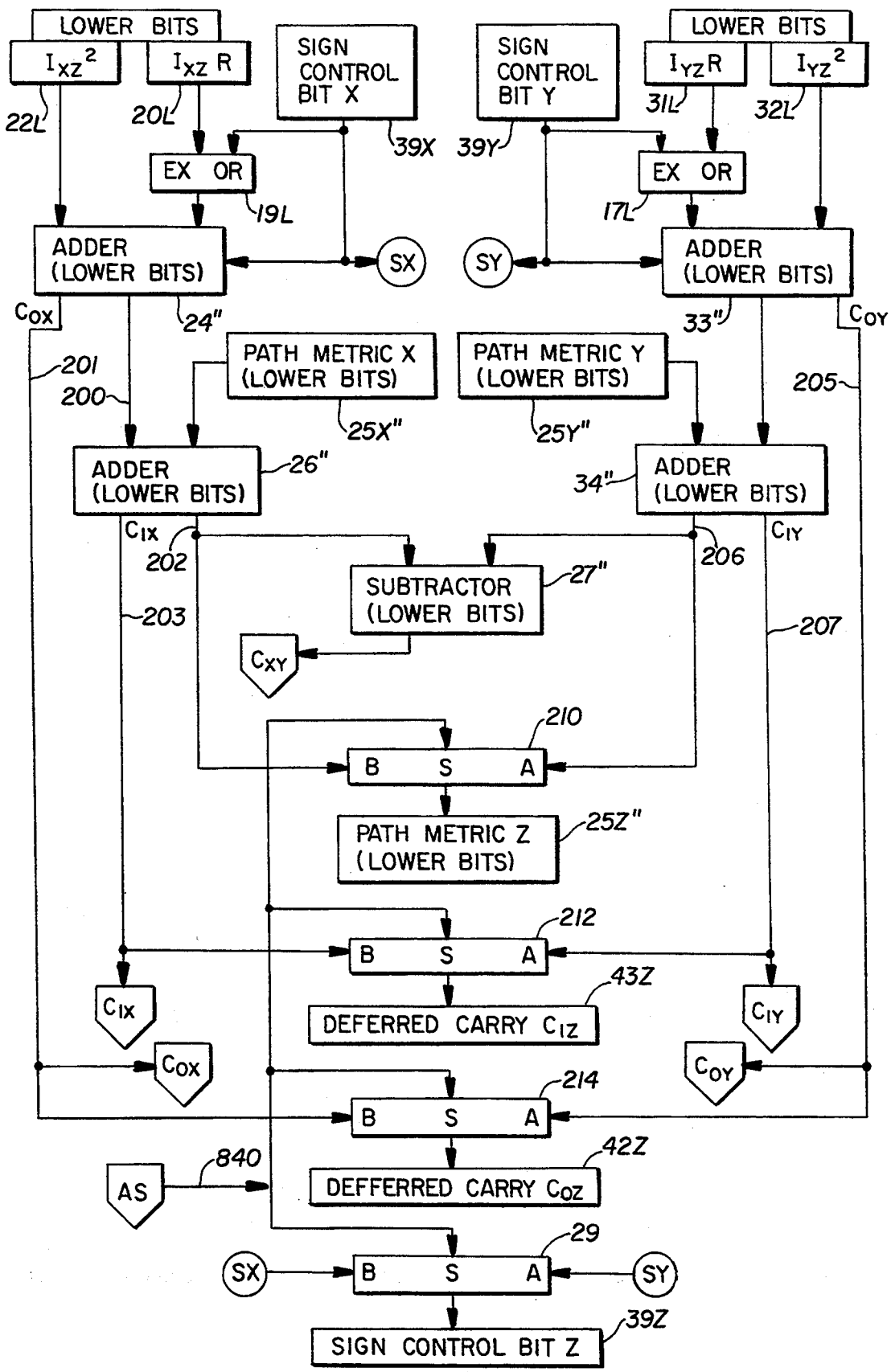
FIG. 12 is a circuit diagram showing a portion of the ACS circuit of the invention for lowermost bits.
Figure 13:
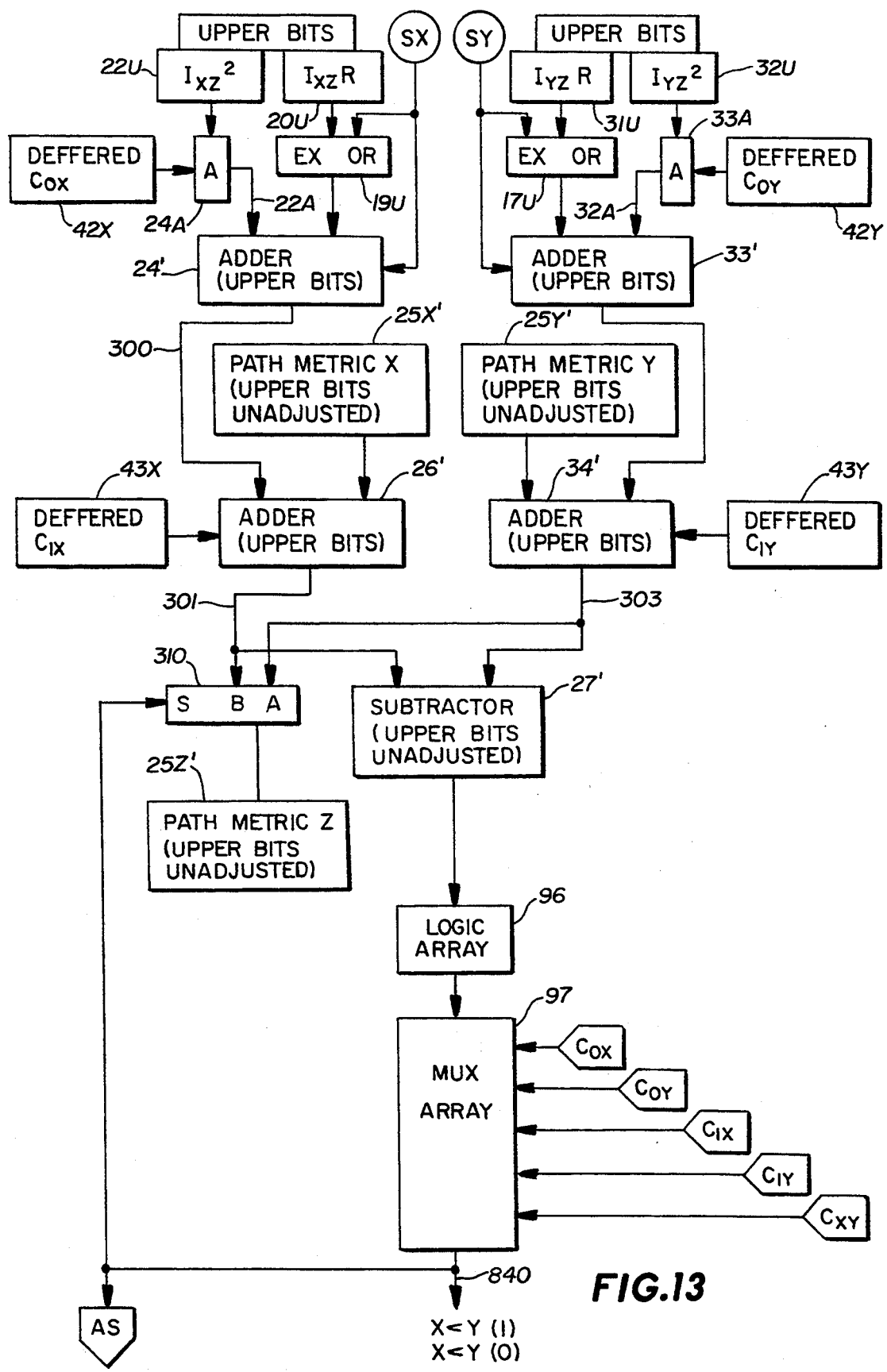
FIG. 13 is a circuit diagram showing a portion of the ACS circuit of the invention for uppermost bits.

Before continuing with a description of FIG. 11, it may be useful to understand FIGS. 12 and 13. FIG. 12 is a circuit similar to FIG. 6, but in FIG. 12 only the least significant bits are added. In the example, where 13-bit addends are to be added and the three most significant bits are added separately, only the ten least significant bits of the 13-bit addends are added together in the circuit shown in FIG. 12.

Adder 24" is similar to adder 24 in FIG. 6 in that it receives as input the ten least significant bits of the first addend quantity $I_{XZ}R$ and the second addend quantity $I_{XZ}2$, together with the sign control bit for the X path (folded sequence detector). The output of adder 24" on line 200 is the branch metric of the lowermost bits for the X path and is input to adder 26". The second output from adder 24" is the carry bit $C_{OX}$ on line 201. Adder 26" receives as an input from the X path register 25X" the previously calculated ten least significant bits of the path metric for the X path. That quantity represents the error tally (lowermost bits) associated with that state from which path X originates. That quantity is added to the branch metric on line 200 in adder 26" to produce a new X path metric (lowermost bits only) on line 202 and a carry bit, $C_{1X}$, on line 203.

While the additive process in adder 24" is in operation for the X path, a similar process occurs in adder 33" for the Y path. Adder 33" receives as input the ten least significant bits of $I_{YZ}R$, $I_{YZ}2$, and the sign control bit for the Y path in order to produce a branch metric for the Y path (lowermost bits only). The second output of adder 24" is the carry bit $C_{OY}$ on line 205. Adder 34" receives as an input from register 25Y" the previously calculated ten least significant bits of the path metric for the Y path. That quantity represents the error tally (lowermost bits) associated with that state from which path Y originates. That quantity is added to the branch metric on line 204 in adder 33" to produce a new path metric for the Y path (lowermost bits only) on line 206 and a carry bit $C_{1Y}$ on line 207. The additive process in adder 34" for the Y path occurs simultaneously with the additive process in adder 26" for the X path.

Subtractor 27" subtracts the new Y path metric (lowermost bits) on line 206 from the new X path metric on line 202. The resultant carry bit $C_{XY}$ is utilized for determining which path provides the closest match to the respective idealized signals $I_{XZ}$ and $I_{YZ}$ in the uppermost bit circuit of FIG. 13. The carry bits $C_{OX}$, $C_{1X}$, $C_{OY}$, and $C_{1Y}$ are also used in that determination, as described below.

FIG. 13 is a circuit similar to FIG. 6 and to FIG. 12 in which the uppermost bits of the addends are added separately from and simultaneously with the lowermost bit addition processes described above with reference to FIG. 12. In the embodiment described, 13-bit addends are divided into the ten lowermost bits for separate and simultaneous addition from the three uppermost bits.

In FIG. 13, adder 24', which is similar to adder 24 in FIG. 6, receives as input the three most significant bits of the first addend quantity, $I_{XZ}R$, and the second addend quantity $I_{XZ}^2$, together with the sign control bit for the X path (folded sequence detector). The sign control bit is conveniently included in the addition by placing it on the carry input of the first add module in adder 24'. Adder 24' also receives as input from register 42X the carry bit "deferred $C_{OX}$" which is the carry bit $C_{OX}$ deferred from the lowermost bit addition process in adder 24" performed during the previous cycle. The quantity comprised of the upper bits of $I_{XZ}^2$ and the "deferred $C_{OX}$" quantity are added together in adder 24A. That sum is then presented to adder 24' on line 22A.

The carry bit "deferred $C_{OX}$" is included in the calculations at adder 24' to arrive at correct error tallies for the path. However, use of adder 24A may cause the entire process to exceed a duration of one cycle. Alternatives to adder 24A include placing the "deferred $C_{OX}$" bit quantity directly on the input line 22A to adder 24' when the upper bit quantity $I_{XZ}^2$ will always be zero. Since $I_{XZ}^2$ is a constant term, the circuit can be designed such that the entire term is included in the lower bit addition of FIG. 12 having only zero in the upper bits of the $I_{XZ}^2$ term for inclusion in the additive process of FIG. 13. A second alternative to adder 24A where the upper bits of $I_{XZ}^2$ are non-zero is to replace adder 24A with a mux circuit in which either the constant term $I_{XZ}^2$ or $I_{XZ}^2+1$ can be selected. The selected quantity will depend on the value of "deferred $C_{OX}$" which acts as the selection argument. In this arrangement, both $I_{XZ}^2$ and $I_{XZ}^2+1$ are previously calculated and ready for selection as soon as deferred $C_{OX}$ becomes known. The selected quantity is the input on line 22A to adder 24'.

The output of adder 24' on line 300 is the unadjusted branch metric of the uppermost bits for the X path (unadjusted since it does not include the carry $C_{OX}$ from the lowermost bit addition which is underway simultaneously on the current cycle). The unadjusted branch metric on line 300 is input to the adder 26'. Adder 26' also receives as an input from register 25X' the previously calculated three most significant bits of the unadjusted path metric associated with the state from which the X path originates. Adder 26' also receives from register 43X the carry bit "deferred $C_{1X}$", which is the carry bit $C_{1X}$ deferred from the lowermost bit addition process in adder 26" performed during the previous cycle. The carry bit "deferred $C_{1X}$" is now included in the calculations to arrive at correct error tallies for the path Inclusion of "deferred $C_{1X}$" is efficiently accomplished during the current cycle by using the carry input to the first add module of adder 26'. Those quantities are added to the unadjusted branch metric on line 300 in adder 26' to produce a new unadjusted X path metric of the uppermost bits on line 301 (unadjusted since it does not include the carrys $C_{OX}$ and $C_{1X}$ from the lowermost bit addition processes underway simultaneously on the current cycle). The unadjusted X path metric on line 301 is input to the subtractor 27'.

While the additive processes in adders 24' and 26' are in operation for the X path, similar processes occur in adders 33' and 34' for the Y path. Adder 33' receives as input the three most significant bits of $I_{YZ}R$, $I_{YZ}^2$, the sign control bit for the Y path and the "deferred $C_{OY}$ carry bit" in order to produce an unadjusted branch metric for the Y path uppermost bits on line 302 (unadjusted since it does not include the carry $C_{OY}$ from the addition of the lowermost bits underway simultaneously on the current cycle). Adder 33A performs in a manner similar to adder 24A and may be replaced by the alternative configurations discussed above with reference to adder 24A.

Line 302 is connected to adder 34' for adding the unadjusted branch metric to the previously calculated unadjusted path metric of the Y path (three most significant bits only) from register 25Y' and the "deferred $C_{1Y}$ carry bit" from register 43Y to produce a new unadjusted path metric for the Y path uppermost bits on line 303 (unadjusted since it does not include the effect of the carry bits, $C_{OY}$ and $C_{1Y}$, from the addition of the lowermost bits underway simultaneously on the current cycle).

Subtractor 27' subtracts the new unadjusted Y path metric (uppermost bits) on line 303 from the new unadjusted X path metric (uppermost bits) on line 301 to determine which path metric represents the closest match to the idealized signals $I_{XZ}$ and $I_{YZ}$ (uppermost bits only). The resultant comparison sum on line 304 must be adjusted to accommodate the effect of the five carry bits from the lowermost bit additive and subtractive processes $C_{OX}$, $C_{OY}$, $C_{1X}$, $C_{1Y}$ and $C_{XY}$ before the upper bit of the comparison sum on line 304 can accurately reflect which path metric actually represents the closest match. The invention herein provides for that adjustment to arrive at an accurate comparison on the current cycle without actually adding the carry bits into the path metrics being compared. Thus when there is no time on the current cycle to accomplish adding the bits into the path metric, those carry bits for the surviving path are saved and included in the calculations on the next cycle as "deferred carry bits" as discussed above.

Returning now to the interrupted discussion of FIG. 11, the effect of the five carry bits to arrive at an accurate comparison is accommodated according to the logic of FIGS. 8, 9 and 10 by providing the signals $D_{-2}$ through $D_3$ from logic array 96 on line 305 as input to mux circuit 97. FIG. 13 shows that the logic array 96 receives as input the unadjusted comparison sum of the three uppermost bits of the path metrics for the X and Y paths on line 304. The three bits on line 304 correspond to $b_{sign}$, $b_1$ and $b_0$ shown at 100 on the logic table of FIG. 10.

To illustrate, suppose that the comparison sum of the three most significant bits equals $-3$, that is, $b_{sign}$, $b_1$ and $b_0$ are "101". In that case, according to FIG. 10, the input quantities to mux circuit 97 are $D_{-2}=0$, $D_{-1}=1$, $D_0=1$, $D_1=1$, $D_2=1$, and $D_3=0$. These input quantities are shown on FIG. 11 in parenthesis following the decode "D" input for each in following the description herein. Suppose further, for illustration, that the first carry-in quantity is $C_{OX}=1$ which is the carry bit derived from adding the least significant bits of the addends presented to adder 24". Suppose that the second carry-in quantity $C_{OY}=0$ (from adder 33"), the third carry-in quantity $C_{1X}=1$ (from adder 26"), $C_{1Y}=1$ (from adder 34"), and $C_{XY}=0$ (from subtractor 27"). In such case, the selection signal S at mux module 70 is a 1, thus selecting the "A" input to mux 70 and therefore selecting the signal $D_{-1}$ which in this illustration equals "1". Therefore, mux 70 produces an output of "1" appearing on line 700 and for ease in following the description herein the "1" is shown on FIG. 11 in parentheses following the reference numeral 700. Similarly, the "A" input is selected for mux modules 71–74 by virtue of the carry signal $C_{OX}=1$. As a result, an output of "1" appears on line 710; an output of "1" appears on line 720, a "1" output is selected for line 730, and a "0" appears on line 740. Again, these output signals are shown in parentheses on FIG. 11 next to the reference numeral. At module 75, the selection signal is the inverse of the carry signal $C_{OY}$. The carry signals from the Y path, $C_{OY}$ and $C_{1Y}$ are inverted by invertors 68 and 69 to reflect the fact that the Y path is subtracted from the X path in subtractor 27 or, with reference to FIG. 8, the carrys for the Y path shift the result in the direction B rather than in direction A. Since $C_{OY}=0$ in this illustration, the inverse is "1", and consequently the "A" input is selected for modules 75, 76, 77 and 78. As a result, a "1" signal appears on line 750, a "1" signal appears on line 760, line 770 has a "1" signal, and line 780 has a "0" signal.

The carry signal $C_{1X}=1$ is connected to the select input for mux modules 79, 80 and 81. Consequently, the "A" input is selected for connection to the module output. As a result, an output signal of "1" appears on line 790, a signal of "1" appears on line 800, and a signal of "0" appears on line 810.

The carry signal $C_{1Y}=1$ is inverted to "0" since $C_{1Y}$ is a carry from the Y path and therefore shifts the result in the opposite direction from X path carrys. A "0" on the select port of each mux module 82 and 83 selects the "B" input for connection to the module output. Consequently, a "1" signal appears on line 820 and a "1" signal is selected for line 830.

The carry signal $C_{XY}=0$ is applied to the select port for mux module 84, causing a selection of the "B" input, thereby providing a "1" signal on the output line 840. The signal on line 840 is the adjusted uppermost bit of the comparison of the new unadjusted X path metric to the new unadjusted Y path metric. Since the value is "1", the adjusted comparison reveals that the quantity is negative and therefore the X path error tally is less than the Y path error tally. This accurate comparison result is obtained without calculating the exact error tallies and is obtained speedily through use of logic array (96 and mux array 97).

To check this result against the logic of FIG. 8, note that for a comparison sum of −3, line 65, with a sum of one positive carry-in bit, a one place shift is made in the direction A resulting in a negative final output quantity, thus verifying the correctness of the above result for the illustration provided.

Referring again to FIG. 13, note the signal "1" on line 840 is used to select the unadjusted path metric quantity on the X path line 301 in mux module 310 as the Z upper bit path metric for storage in register 25Z'. Referring to FIG. 12, note that the "1" signal on line 840 is used to select the "B" input of mux module 210, thereby selecting the new X path metric on line 202 as the Z path metric (lowermost bits) for storage in register 25Z". Note also that the carry bits from the X path are selected at mux modules 212 and 214 for storing the carry bits $C_{OX}$ and $C_{1X}$ as the deferred carry bits $C_{OZ}$ and $C_{1Z}$ for use on the next subsequent cycle. Finally, at mux module 29, the sign control bit for the X path is selected for storage in register 39Z at node Z for use as the sign control bit for the Z path.

All of the above determinations involving the circuits of FIGS. 12 and 13 are performed within a single clock cycle. In the illustration provided, at the conclusion of that cycle the quantity representing the new X path metric has been determined to represent the closest match to an idealized expected signal, and therefore X path quantities are chosen for entry into the registers at node Z. However, although the X path is selected and the Y path discarded, the actual value of the path metric at node Z has not been calculated since the carry bits from the current cycle, $C_{OX}$ and $C_{1X}$, were not added in the calculation of the upper bit path metric. That step is performed on the next cycle and therefore $C_{OX}$ is saved in register 42Z as "deferred carry bit $C_{OZ}$" and $C_{1X}$ is saved in register 43Z as "deferred carry bit $C_{OZ}$". As shown on FIG. 13, the carrys deferred to the next cycle are input to adders 24' and 26' or adders 33' and 34', as appropriate.

It may be observed that the accurate 10 lowermost bits of the Z path metric are contained in register 25Z'. However, the quantity in register 25Z" is an unadjusted addition of the three uppermost bits of the X path metric. To be accurate, that quantity must be adjusted by the two input carry bits $C_{OX}$ and $C_{1X}$, that is, the "deferred carry bits $C_{OZ}$ and $C_{1Z}$". The addition of those carrys is accomplished on the next cycle in the appropriate adder circuits so that all quantities in arriving at an exact Z path metric are utilized in forming the error tally.

Thus, circuits have been provided for determining a lesser value of two quantities before the actual values of those quantities is calculated. The result is to optimize speed in arriving at correct determinations in a sequence detector to minimize the effect of the detection process on the ability to more densely pack data in magnetic storage disks.

It should be noted that while this invention has been illustrated as dividing 13-bit quantities into the addition of the least significant 10 bits separately and simultaneously from the addition of the upper 3 bits, a balance must be made in performing the additions within a cycle time. The use of various semiconductor technologies might result in a better balance if 9 lower bits were added separately and simultaneously with 4 upper bits. In general, the approach is to add the m most significant bits of an n bit quantity simultaneously with and separately from the least significant n minus m bits.

It should also be noted that the logic shown in FIG. 10 is directed to an embodiment where the three uppermost bits were utilized. Suppose that the addends were 20-bit quantities with the 10 least significant bits added separately from and simultaneously with three of the 10 most significant bits. In such case, the three bits to choose are $b_{sign}$, $b_1$ and $b_0$, that is, the sign bit and the two least significant of the 10 most significant bits. The logic of FIG. 10 would be altered for that embodiment and for any other variation of a similar nature; otherwise, the circuits remain the same.

The invention has been described for an ACS circuit in a sequence detector used with magnetic recording equipment. It should be observed that the improved speed of a detector using this invention may be of value wherever sequence detectors are used, whether that be with other types of data storage equipment or in the communication field or elsewhere. Finally, an improved ACS circuit such as described herein is of value in all other applications of ACS circuits, wherever speed is important.

While the invention has been shown and described with reference to particular embodiments, other embodiments may serve equally well. It should be understood that various changes in form and details may be made by those of skill in the art without departing from the spirit and scope of the invention.

We claim:

1. A digital circuit comprising:
   first adder means for adding the lowermost bits of a first two quantities to produce a first sum and a first carry bit;
   second adder means for adding the most significant bits of said first two quantities to produce a second sum;
   third adder means for adding the lowermost bits of a second two quantities to produce a third sum and a second carry bit;
   fourth adder means for adding the most significant bits of said second two quantities to produce a fourth sum;
   first comparison means to subtract said third sum from said first sum to produce a first difference and a third carry bit;
   second comparison means to subtract said fourth sum from said second sum to produce a second difference; and
   means to adjust the result of said second comparison in accordance with said carry bits to obtain an adjusted uppermost bit in said second difference and thereby correctly indicate whether the sum of said first two quantities or the sum of said second two quantities is least without determining the exact value of the summation quantities.

2. The circuit of claim 1 wherein said means to adjust comprises:
   logic array circuit means connected to said comparison means for receiving said second difference and for producing a series of decode signals in accordance with said second difference;
   multiplexer (mux) circuit means connected to said logic array means for receiving said series of decode signals and for receiving said carry bits as said mux circuit selection arguments to shift the output signals produced by said logic array means in accordance with said carry bits, the resulting output signal produced by said mux circuit being the adjusted uppermost bit of said second difference.

3. The circuit of claim 2 wherein said logic array circuit means produce said series of decode signals in accordance with the range of values for said second difference needed to shift said second difference into a negative quantity by including the effect of said carry bits, where a carry bit is positive from the addition of said first two quantities and negative from the addition of said second two quantities.

4. A digital circuit for adding quantities, comparing sums and selecting a least sum wherein said quantities are divided into a multibit sub-quantity containing the lowermost bits and a multibit sub-quantity containing the most significant bits, comprising:
   first adder means for adding the lowermost bits of a first two quantities to produce a first sum and a first carry bit;
   second adder means for adding the most significant bits of said first two quantities to produce a second sum;
   third adder means for adding the lowermost bits of said first sum with the lowermost bits of a first additional quantity to produce a third sum and a second carry bit;
   fourth adder means for adding the most significant bits of said second sum with the most significant bits of said first additional quantity to produce a fourth sum;
   fifth adder means for adding the lowermost bits of a second two quantities to produce a fifth sum and a third carry bit;
   sixth adder means for adding the most significant bits of said second two quantities to produce a sixth sum;
   seventh adder means for adding the lowermost bits of said fifth sum with the lowermost bits of a second additional quantity to produce a seventh sum and a fourth carry bit;
   eighth adder means for adding the most significant bits of said sixth sum with the most significant bits of said second additional quantity to produce an eighth sum;
   first subtractor means for comparing sums by subtracting said seventh sum from said third sum to produce a first difference having the lowermost bits of the comparison therein, and a fifth carry bit;
   second subtractor means for comparing sums by subtracting said eighth sum from said fourth sum to produce a second difference having the most significant bits of the comparison therein; and
   means to adjust said second difference in accordance with the carry bits to obtain an adjusted uppermost bit in said second difference to provide the correct sign of the comparison and thereby accurately indicate whether a first summation of said third sum with said fourth sum is greater or less than a second summation of said seventh sum with said eighth sum, without performing said first and second summations.

5. The circuit of claim 4 wherein said means to adjust comprises:
   logic array circuit means connected to said second subtractor means for receiving said second difference and for producing a series of decode signals in accordance with said second difference; and
   first multiplexer (mux) circuit means connected to said logic array means for receiving said series of decode signals and for receiving said carry bits as said first mux circuit selection arguments to select the decode signals produced by said logic array means in accordance with said carry bits, the resulting output signal produced by said first mux circuit being the adjusted uppermost bit of said second difference.

6. The circuit of claim 5 wherein said logic array circuit means produces said series of decode signals in accordance with the range of values for said second difference needed to shift said second difference into a negative quantity by including the effect of said carry bits, where said first, second and fifth carry bits are positive and said third and fourth carry bits are negative.

7. The circuit of claim 4 wherein said digital circuit is an add, compare and select module within a sequence detector, and in which the sums and carry bits produced by said first and said second adder means taken together represent the branch metric for a first path entering a current state Z of said sequence detector, said module further comprising:
 first register means connected to said third adder means, said first register means for holding the lowermost bits of said first additional quantity, said first additional quantity being the path metric associated with that state of said sequence detector from which said first path originates; and
 second register means connected to said fourth adder means, said second register means for holding the most significant bits of said first additional quantity and where the sums and carry bits produced by said third and said fourth adder means taken together represent said branch metric for said first path added to said path metric associated with the state from which said first path originates and thereby represent a new path metric associated with said first path for said current state.

8. The circuit of claim 7 wherein said digital circuit is an add, compare and select module within a sequence detector, and in which the sums and carry bits produced by said fifth and said sixth adder means taken together represent the branch metric for a second path entering a current state of said sequence detector, said module further comprising:
 third register means connected to said seventh adder means, said third register means for holding the most significant bits of said second additional quantity, said second additional quantity being the path metric associated with that state of said sequence detector from which said second path originates; and
 fourth register means connected to said eighth adder means, said fourth register means for holding the most significant bits of said second additional quantity and where the sums and carry bits produced by said seventh and said eighth adder means taken together represent said branch metric for said second path added to said path metric associated with the state from which said second path originates and thereby represent a new path metric associated with said second path for said current state.

9. The circuit of claim 8 further including:
 fifth register means connected to said second adder means, said fifth register means for holding a "deferred carry bit $C_{OX}$", said $C_{OX}$ representing a carry deferred from the lowermost bit addition performed by said first adder means during the directly preceding cycle of detector operation;
 sixth register means connected to said sixth adder means, said sixth register means for holding a "deferred carry bit $C_{OY}$" said $C_{OY}$ representing a carry deferred from the lowermost bit addition performed by said fifth adder means during the directly preceding cycle of detector operation;
 seventh register means connected to said fourth adder means, said seventh register means for holding a "deferred carry bit $C_{1X}$" said $C_{1X}$ representing a carry deferred from the lowermost bit addition performed by said third adder means during the directly preceding cycle of detector operation; and
 eighth register means connected to said eighth adder means, said eighth register means for holding a "deferred carry bit $C_{1Y}$" said $C_{1Y}$ representing a carry deferred from the lowermost bit addition performed by said seventh adder means during the directly preceding cycle of detector operation.

10. The circuit of claim 9 wherein said sequence detector is a folded detector and said first and second adder means operate to produce a branch metric for said first path according to the expression:

Branch Metric$_{XZ} = R^2 \pm 2I_{XZ}R + I_{XZ}^2$ where R is the value of a discrete sample of a signal received by said sequence detector and $I_{XZ}$ is an expected ideal branch metric signal value for said first path from state X to state Z;
 said fifth and sixth adder means operate to produce a branch metric for said second path according to the expression:

Branch Metric$_{YZ} = R^2 35\ 2I_{YZ}R + I_{YZ}^2$ where $I_{YZ}$ is an expected ideal branch metric signal value for said second path from state Y to state Z, said circuit further including:
 ninth register means connected to said first adder means, said ninth register means for holding the lowermost bits of the quantity $I_{XZ}^2$;
 tenth register means connected to said second adder means, said tenth register means for holding the most significant bits of the quantity $I_{XZ}^2$;
 eleventh register means connected to said first adder means, said eleventh register means for holding the lowermost bits of the quantity $I_{XZ}R$;
 twelfth register means connected to said second adder means, said twelfth register means for holding the most significant bits of the quantity $I_{XZ}R$;
 thirteenth register means connected to said fifth adder means, said thirteenth register means for holding the lowermost bits of the quantity $I_{YZ}^2$;
 fourteenth register means connected to said sixth adder means, said fourteenth register means for holding the most significant bits of the quantity $I_{YZ}^2$;
 fifteenth register means connected to said fifth register means, said fifteenth register means for holding the lowermost bits of the quantity $I_{YZ}R$; and
 sixteenth register means connected to said sixth adder means, said sixteenth register means for holding the most significant bits of the quantity $I_{YZ}R$.

11. The circuit of claim 10 further including seventeenth register means connected to said first and second adder means, said seventeenth register means for holding a sign control bit$_X$ which represents the sign of said state from which said first path originates; and
 eighteenth register means connected to said fifth and said sixth adder means, said eighteenth register means for holding a sign control bit$_Y$ which represents the sign of said state from which said second path originates.

12. The circuit of claim 11 further including:
 second mux circuit means connected to receive said third sum and said seventh sum and to receive said adjusted uppermost bit of said second difference as a selection signal;

nineteenth register means connected to said second mux circuit, said nineteenth register means for holding the selected sum which is the lowermost bits of the path metric associated with the current state Z of said sequence detector;

third mux circuit means connected to receive said fourth sum and said eighth sum and to receive said adjusted uppermost bit of said second difference as a selection signal; and twentieth register means connected to said third mux circuit, said twentieth register means for holding the selected sum which is the most significant bits of the path metric associated with the current state Z of said sequence detector.

13. The circuit of claim 12 further including:

fourth mux circuit means connected to receive said second carry bit $C_{1X}$, said fourth carry bit $C_{1Y}$ and to receive as a selection signal said adjusted uppermost bit of said second difference;

twenty-first register means connected to said fourth mux circuit, said twenty-first register means for holding the selected sum which is the "deferred carry bit $C_{1Z}$";

fifth mux circuit means connected to receive said first carry bit $C_{0X}$, said third carry bit $C_{0Y}$, and to receive as a selection signal said adjusted uppermost bit of said second difference;

twenty-second register means connected to said fifth mux circuit means, said twenty-second register means for holding the selected sum from said fifth mux means which is the "deferred carry bit $C_{0Z}$";

sixth mux circuit means connected to receive said sign control bit $X$ and said sign control bit $Y$, and to receive as a selection signal said adjusted uppermost bit of said second difference; and twenty-third register means connected to said sixth mux circuit means, said twenty-third register means for holding the selected bit from said sixth mux means which is the sign control bit for said current state Z.

14. The method of selecting the lowest of two quantities without previously determining the exact value of said two quantities or their difference comprising the machine executed steps of:

first adding the lowermost bits of a first addend with the lowermost bits of a second addend to produce a first sum and a first carry bit;

separately and simultaneously with said first adding step, second adding the most significant bits of said first addend with the most significant bits of said second addend to produce a second sum;

separately and simultaneously with said first adding, third adding the lowermost bits of a third addend with the lowermost bits of a fourth addend to produce a third sum and a second carry bit;

separately and simultaneously with said first adding, fourth adding the most significant bits of said third addend with the most significant bits of said fourth addend to produce a fourth sum;

first subtracting said third sum from said first sum to produce a first difference and a third carry bit;

separately and simultaneously with said first subtracting, second subtracting said fourth sum from said second sum to produce a second difference; and adjusting the second difference in accordance with the value of said carry bits to obtain an adjusted uppermost bit thereby indicating which quantity is least without determining the exact value of said two quantities or their difference.

15. The method of claim 14 wherein the step of adjusting includes:

producing a series of decode signals by a logic circuit in accordance with said fourth sum; and shifting said decode signals through a multiplexer circuit with the carry bits used as the selection signals.

* * * * *